United States Patent
Chatwin

(10) Patent No.: US 7,817,764 B2
(45) Date of Patent: Oct. 19, 2010

(54) SYSTEM AND METHOD FOR UTILIZING A PHASE INTERPOLATOR TO SUPPORT A DATA TRANSMISSION PROCEDURE

(75) Inventor: Jeremy Chatwin, Santa Cruz, CA (US)

(73) Assignee: Sony Corporation, Tokyo (JP)

( * ) Notice: Subject to any disclaimer, the term of this patent is extended or adjusted under 35 U.S.C. 154(b) by 778 days.

(21) Appl. No.: 11/731,292

(22) Filed: Mar. 30, 2007

(65) Prior Publication Data

US 2008/0063125 A1 Mar. 13, 2008

Related U.S. Application Data

(60) Provisional application No. 60/844,589, filed on Sep. 13, 2006.

(51) Int. Cl.
*H04L 7/00* (2006.01)
(52) U.S. Cl. .................................. 375/371; 375/376
(58) Field of Classification Search .................. 375/371, 375/376, 224, 355, 373
See application file for complete search history.

(56) References Cited

U.S. PATENT DOCUMENTS

| | | | | | |
|---|---|---|---|---|---|
| 6,122,336 | A | * | 9/2000 | Anderson | 375/371 |
| 6,137,325 | A | * | 10/2000 | Miller, Jr. | 327/156 |
| 6,445,248 | B1 | * | 9/2002 | Gilbert | 330/51 |
| 7,089,442 | B2 | * | 8/2006 | Chang et al. | 713/501 |
| 2001/0026179 | A1 | * | 10/2001 | Saeki | 327/147 |
| 2003/0048863 | A1 | * | 3/2003 | Saeki | 375/376 |
| 2003/0112908 | A1 | * | 6/2003 | Mar | 375/355 |
| 2006/0067391 | A1 | * | 3/2006 | Garlepp | 375/224 |
| 2006/0071691 | A1 | * | 4/2006 | Garlepp | 326/93 |
| 2007/0146035 | A1 | * | 6/2007 | Law et al. | 327/231 |

* cited by examiner

*Primary Examiner*—Emmanuel Bayard
(74) *Attorney, Agent, or Firm*—Gregory J. Koerner; Redwood Patent Law

(57) ABSTRACT

A system and method for effectively supporting a data transmission procedure includes a phase interpolator with a modular array of unit phase interpolators that each receives a respective input clock signal that is phase-shifted with respect to other input clock signals received by the remaining unit phase interpolators. The unit phase interpolators responsively generate corresponding UPI output signals that are summed together to produce a receiver clock signal. The phase interpolator receives a phase control word that includes a UPI selection segment and a UPI output-control segment. The phase interpolator utilizes the UPI selection segment to selectively activate pairs of the unit phase interpolators. The phase interpolator also utilizes the UPI output-control segment for controlling the UPI output signals to thereby adjust phase characteristics of the receiver clock signal.

41 Claims, 10 Drawing Sheets

Fig. 6    UPI

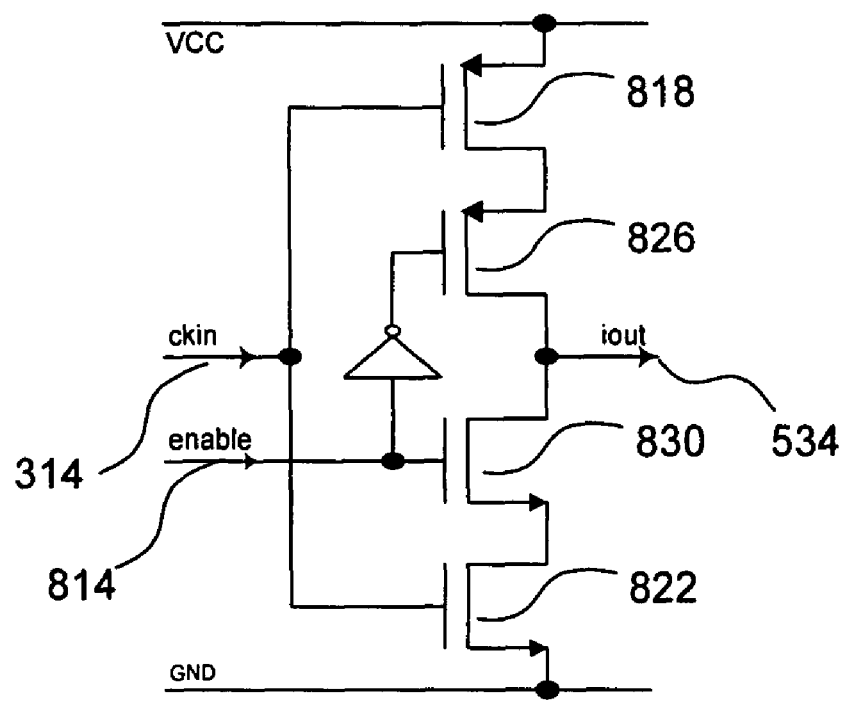
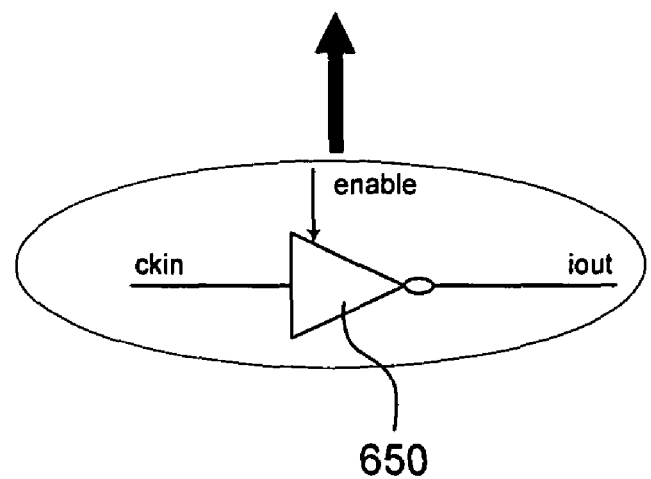
Fig. 8

INPUTS PH[5:3]:  OUTPUTS [0:7]:

| PH[5] | PH[4] | PH[3] | 0 | 1 | 2 | 3 | 4 | 5 | 6 | 7 |
|---|---|---|---|---|---|---|---|---|---|---|
| 0 | 0 | 0 | 1 | 0 | 0 | 0 | 0 | 0 | 0 | 0 |
| 0 | 0 | 1 | 0 | 1 | 0 | 0 | 0 | 0 | 0 | 0 |
| 0 | 1 | 0 | 0 | 0 | 1 | 0 | 0 | 0 | 0 | 0 |
| 0 | 1 | 1 | 0 | 0 | 0 | 1 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

MSB Decoder Truth Table

Fig. 9

| sel_left | sel_right | PH[2] | PH[1] | PH[0] | iout current units (UPI drive strength) |
|---|---|---|---|---|---|
| 0 | 0 | X | X | X | 0 |
| 0 | 1 | 0 | 0 | 0 | 0 |
| 0 | 1 | 0 | 0 | 1 | ±1 |
| 0 | 1 | 0 | 1 | 0 | ±2 |
| 0 | 1 | 0 | 1 | 1 | ±3 |
| 0 | 1 | 1 | 0 | 0 | ±4 |
| 0 | 1 | 1 | 0 | 1 | ±5 |
| 0 | 1 | 1 | 1 | 0 | ±6 |
| 0 | 1 | 1 | 1 | 1 | ±7 |
| 1 | 0 | 0 | 0 | 0 | ±8 |
| 1 | 0 | 0 | 0 | 1 | ±7 |
| 1 | 0 | 0 | 1 | 0 | ±6 |
| 1 | 0 | 0 | 1 | 1 | ±5 |
| 1 | 0 | 1 | 0 | 0 | ±4 |
| 1 | 0 | 1 | 0 | 1 | ±3 |
| 1 | 0 | 1 | 1 | 0 | ±2 |
| 1 | 0 | 1 | 1 | 1 | ±1 |
| 1 | 1 | X | X | X | Not specified |

UPI Truth Table

Fig. 10

SYSTEM AND METHOD FOR UTILIZING A PHASE INTERPOLATOR TO SUPPORT A DATA TRANSMISSION PROCEDURE

CROSS-REFERENCE TO RELATED APPLICATION

This Application claims priority in U.S. Provisional Patent Application No. 60/844,589 entitled "2.8-3.2 Gb/s/channel Serial Link Transceiver, a Digitally Controlled DLL, and TX Pre-emphasis," that was filed on Sep. 13, 2006. The foregoing related Application is commonly owned, and is hereby incorporated by reference.

BACKGROUND SECTION

1. Field of the Invention

This invention relates generally to techniques for transferring electronic information, and relates more particularly to a system and method for effectively utilizing a phase interpolator to support a data transmission procedure.

2. Description of the Background Art

Implementing effective methods for transferring electronic information is a significant consideration for designers and manufacturers of contemporary electronic systems. However, effectively implementing data transfer systems may create substantial challenges for system designers. For example, enhanced demands for increased system functionality and performance may require more system processing power and require additional hardware resources. An increase in processing or hardware requirements may also result in a corresponding detrimental economic impact due to increased production costs and operational inefficiencies.

Furthermore, enhanced system capability to perform various advanced transfer operations may provide additional benefits to a system user, but may also place increased demands on the control and management of various system components. For example, an enhanced electronic system that effectively transfers digital image data may benefit from an effective implementation because of the large amount and complexity of the digital data involved.

Due to growing demands on system resources and substantially increasing data magnitudes, it is apparent that developing new techniques for implementing and utilizing data transfer systems is a matter of concern for related electronic technologies. Therefore, for all the foregoing reasons, developing effective systems for transferring electronic information remains a significant consideration for designers, manufacturers, and users of contemporary electronic systems.

SUMMARY

In accordance with the present invention, a system and method are disclosed for effectively supporting a data transmission procedure. In accordance with one embodiment of the present invention, a digital delay-locked loop of a receiver device performs a clock regeneration procedure to provide a receiver clock signal for synchronizing output data from the receiver device. The phase detector initially receives input data from a receiver interface or any other appropriate data source. The phase detector also receives the receiver clock signal from a phase interpolator. In response, the phase detector compares the current phase relationship of the input data and the receiver clock, and responsively outputs an up/down signal that represents whether the input data leads or lags the receiver clock signal.

An up/down counter stores a phase control word that is provided to the phase interpolator via a feedback loop to thereby control the phase relationship of the receiver clock with respect to the input data. In certain embodiments, the phase control word is implemented as a six-bit binary word. However, in alternate embodiments, any effective number of binary bits are also contemplated for implementing the phase control word.

The phase detector provides the up/down signal to an up/down counter to cause the internally-stored phase control word to either increment or decrement. An update clock signal is generated for the up/down counter by passing the receiver clock through a programmable divider that divides the frequency of the receiver clock by any desired integer value. The update clock may then be utilized by the up/down counter to periodically trigger updates of the phase control word. The foregoing integer value for programmable divider may thus be selected to choose an optimal response time for the feedback loop that provides the phase control word to the phase interpolator.

In accordance with the present invention, a clock source provides a set of input clocks to the phase interpolator. The input clocks each has a clock phase that is offset with respect to the clock phases of the remaining input clocks. In certain embodiments, the clock source generates eight input clocks. However, in alternate embodiments, any effective number of input clocks may be utilized. The phase interpolator may advantageously perform a clock interpolation procedure upon the input clocks to produce the receiver clock. The receiver clock may thus have a receiver clock phase that is dynamically controlled by the current binary value specified in the phase control word. The receiver device may then utilize the receiver clock to optimally synchronize the output data. For at least the foregoing reasons, the present invention therefore provides an improved system and method for effectively utilizing a phase interpolator to support a data transmission procedure.

BRIEF DESCRIPTION OF THE DRAWINGS

FIG. 8 is a schematic diagram for a current source from FIG. 6, in accordance with one embodiment of the present invention;

FIG. 9 is a truth table for the MSB decoder of FIG. 5, in accordance with one embodiment of the present invention; and FIG. 10 is a truth table for the unit phase interpolator of FIG. 6, in accordance with one embodiment of the present invention.

DETAILED DESCRIPTION

The present invention relates to an improvement in data transmission systems. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as a system and method for effectively supporting a data transmission procedure, and includes a phase interpolator with a modular array of unit phase interpolators. Each of the unit phase interpolators receives a respective input clock signal that is phase-shifted with respect to other input clock signals received by the remaining unit phase interpolators. The unit phase interpolators responsively generate corresponding UPI output signals that are summed together to produce a receiver clock signal. The phase interpolator receives a phase control word that includes a UPI selection segment and a UPI output-control segment. The phase interpolator utilizes the UPI selection segment to selectively activate pairs of the unit phase interpolators. The phase interpolator also utilizes the UPI output-control segment for controlling the UPI output signals to thereby adjust phase characteristics of the receiver clock signal.

Figure 1:
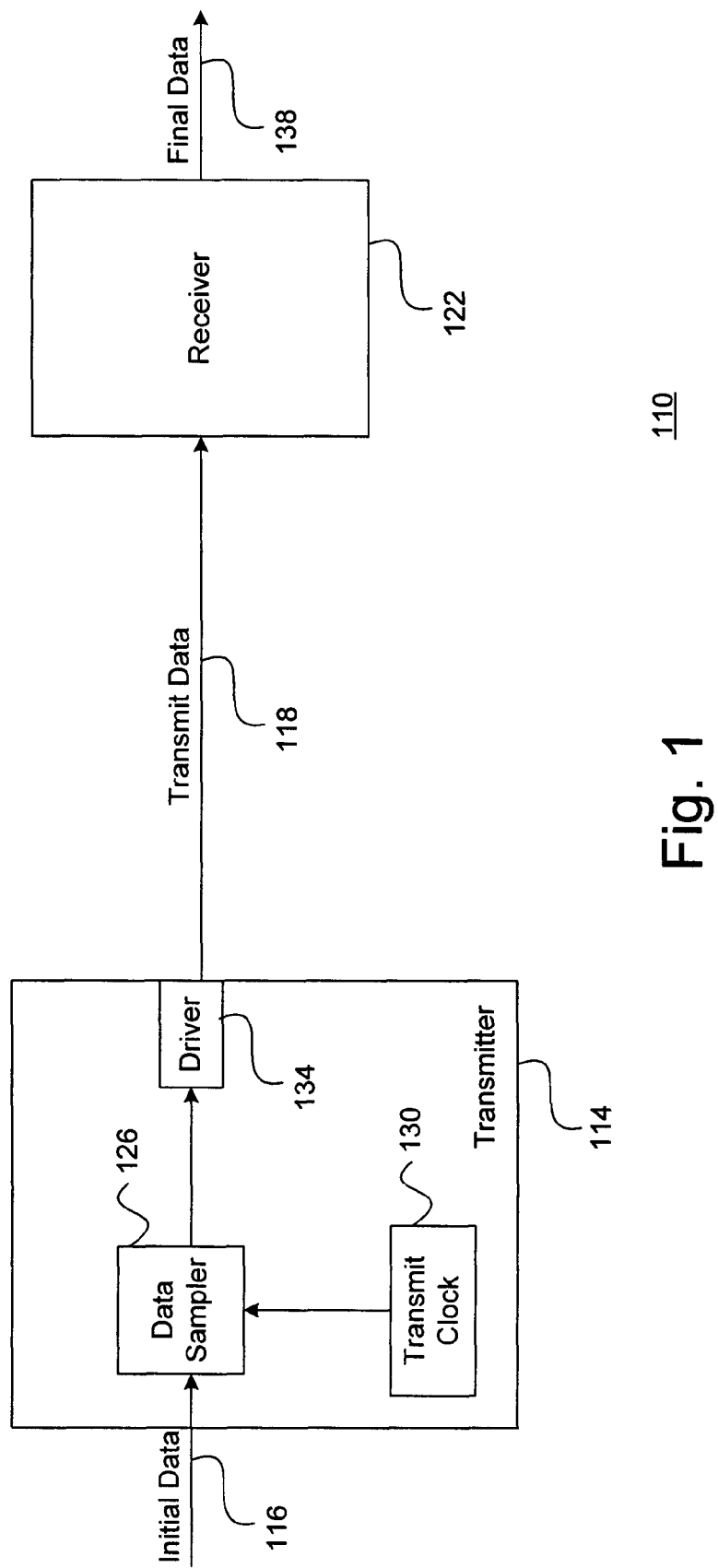
FIG. 1 is a block diagram of a data transmission system, in accordance with one embodiment of the present invention.

Referring now to FIG. 1, a block diagram of a data transmission system 110 is shown, in accordance with one embodiment of the present invention. In the FIG. 1 embodiment, data transmission system 110 includes, but is not limited to, a transmitter 114 and a receiver 122. In alternate embodiments, data transmission system 110 may be implemented using components and configurations in addition to, or instead of, certain of those components and configurations discussed in conjunction with the FIG. 1 embodiment.

In the FIG. 1 embodiment of data transmission system 110, a transmitter 114 utilizes a data sampler 126 to receive initial data 116 from any appropriate data source. Data sampler 126 synchronizes the initial data 116 with reference to a transmit clock 130. A driver 134 then outputs the synchronized initial data 116 over any appropriate type of transmission channel as transmit data 118. A receiver 122 of data transmission system 110 may then receive and process the transmit data 118 to thereby provide final data 138 to any appropriate data destination.

Data transmission system 110 therefore may transfer any desired type of electronic data or information between two separate locations via a transmission channel. These locations may be considerably distant (for example, between continents or between satellites), or may alternately be relatively close to each other (for example, between devices inside electronic equipment). A wide range of physical transmission media may be used to facilitate this transmission. Examples include electromagnetic waves in free space (wireless transmission), or electromagnetic waves in a constrained media (optical fiber, waveguides, cables, etc.).

This transmit data 118 is typically processed into a format that is suitable for transmission across the channel in a manner that maximizes intelligibility (a low incidence of error at the receiver 122, that has a low bit-error rate (BER), that maximizes the data throughput rate (measured in bits/second or symbols/second), and that minimizes certain cost factors such as transmission power, implementation complexity, and maximize spectral efficiency.

One method of processing involves serializing the initial data 116 before transmission, so that each data bit is represented by a unique symbol. These symbols are transmitted across the channel at a particular rate, controlled by transmit clock 130 of transmitter 114. To accurately receive and de-serialize these encoded symbols with a low BER, the receiver 122 may regenerate a local receiver clock that is similar to the transmit clock 130 of transmitter 114 with respect to frequency and phase. This synchronization of the receiver clock to the frequency and phase of incoming transmit data 118 may be advantageously performed by utilizing a Delay Locked Loop (DLL) device during a clock regeneration procedure. Further details regarding the implementation and utilization of receiver 122 are further discussed below in conjunction with FIGS. 2-10.

Figure 2:
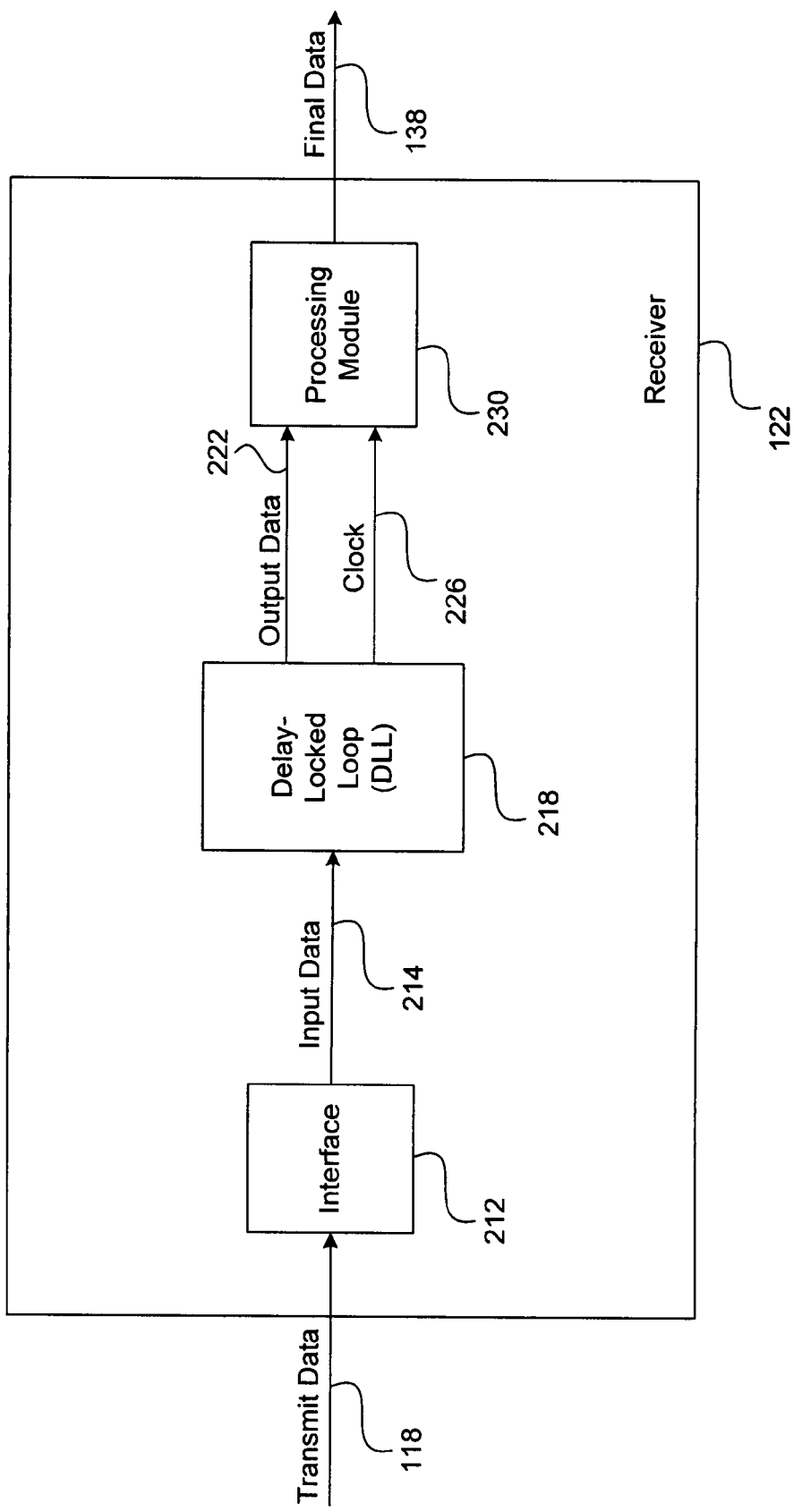
FIG. 2 is a block diagram for one embodiment of the receiver of FIG. 1, in accordance with the present invention.

Referring now to FIG. 2, a block diagram for one embodiment of the FIG. 1 receiver 122 is shown, in accordance with the present invention. In the FIG. 2 embodiment, receiver 122 may include, but is not limited to, an interface 212, a delay-locked loop (DLL) 218, and a processing module 230. In alternate embodiments, receiver 122 may be implemented using components and configurations in addition to, or instead of, certain of those components and configurations discussed in conjunction with the FIG. 2 embodiment. In certain other embodiments, receiver 122 may be implemented as any other appropriate type of electronic device.

In the FIG. 2 embodiment, transmit data 118 may be received from any desired data source, and may be encoded in any appropriate data format. For example, in certain embodiments, transmit data 118 may be received from a transmitter 114 of a data transmission system 110 (FIG. 1). In the FIG. 2 embodiment, interface 212 of receiver 122 converts transmit data 118 into corresponding input data 214 in any appropriate and effective format. In the FIG. 2 embodiment, delay-locked loop (DLL) 218 receives input data 214, and responsively performs a clock regeneration procedure to produce a receiver clock signal 226. A processing module 230 may receive output data 222 and clock 226 for performing any appropriate processing procedures to thereby produce final data 138. Additional details for the implementation and utilization of DLL 218 are further discussed below in conjunction with FIGS. 3-10.

Figure 3:
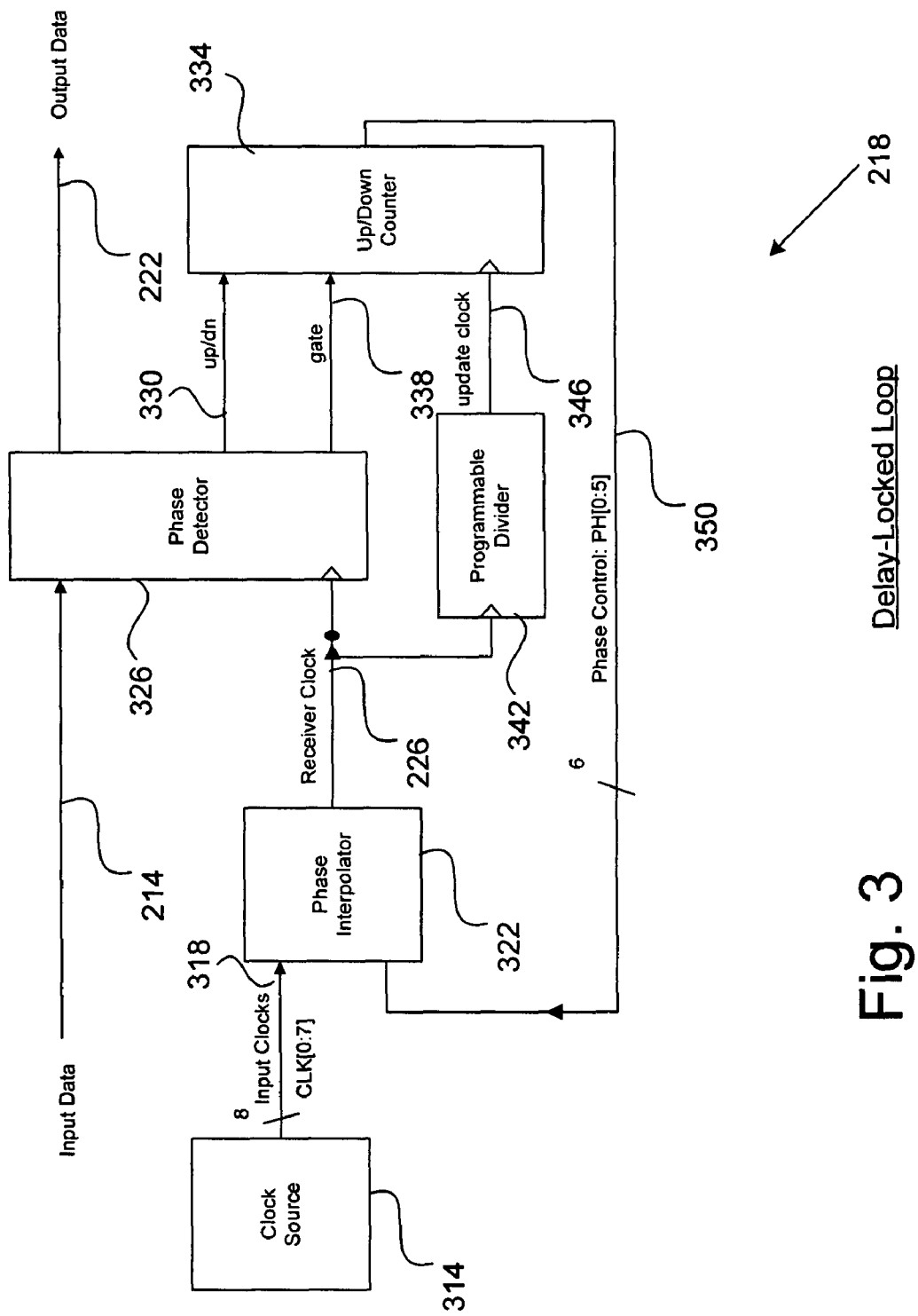
FIG. 3 is a block diagram of the delay-locked loop of FIG. 2, in accordance with one embodiment of the present invention.

Referring now to FIG. 3, a block diagram of the FIG. 2 delay-locked loop 218 is shown, in accordance with one embodiment of the present invention. In alternate embodiments, delay-locked loop 218 may be implemented by utilizing configurations and components in addition to, or instead of, certain of those configurations and components discussed in conjunction with the FIG. 3 embodiment.

In the FIG. 3 embodiment, DLL 218 performs a clock regeneration procedure to provide a receiver clock signal 226 for synchronizing and outputting input data 214 from a phase detector 326 as output data 222. In the FIG. 3 embodiment, phase detector 326 initially receives input data 214 from a receiver interface 212 (FIG. 2) or any other appropriate data source. The phase detector 326 also receives the receiver clock signal 226 from a phase interpolator 322. In response, phase detector 326 compares the current phase relationship of input data 214 and receiver clock 226, and responsively outputs an up/down signal 330 that represents whether input data 214 leads or lags the receiver clock signal 226.

In the FIG. 3 embodiment, an up/down counter 334 stores a binary phase control word 350 that may be provided to phase interpolator 322 via a feedback loop to thereby control the phase relationship of receiver clock 226 with respect to input data 214. In the FIG. 3 embodiment, phase control word 350 is preferably implemented as a six-bit binary word PH[0:5]. However, in certain alternate embodiments, any effective number of binary bits may also be contemplated for implementing phase control word 350.

In the FIG. 3 embodiment, phase detector 326 provides up/down signal 330 to up/down counter 334 to cause the internally-stored phase control word 350 to either increment (up) or decrement (down). Phase detector 326 also provides a gate signal 338 to up/down counter 334 to gate the up/down signal 330 into up/down counter 334. In the FIG. 3 embodiment, an update clock 346 is generated by passing receiver clock 226 through a programmable divider 342 that divides the frequency of receiver clock 226 by any desired integer value. Update clock 346 may then be utilized by up/down counter 334 to periodically trigger updates of the phase control word 350. The foregoing integer value for programmable divider 342 may thus be selected to choose an optimal response time for the feedback loop that provides phase control word 350 to phase interpolator 322.

In the FIG. 3 embodiment, a clock source 314 provides a set of input clocks 318 to phase interpolator 318. In the FIG. 3 embodiment, the input clocks 318 each has a clock phase that is offset with respect to the clock phases of the remaining input clocks 318. In the FIG. 3 embodiment, clock source 314 generates eight input clocks (CLK[0:7]). However, in alternate embodiments, any effective number of input clocks may be utilized. One implementation for the FIG. 3 input clocks 318 is further discussed below in conjunction with FIG. 4.

In the FIG. 3 embodiment, phase interpolator 322 may advantageously perform a clock interpolation procedure upon input clocks 318 to produce a receiver clock 226 that has a receiver clock phase controlled by the current binary value specified in phase control word 350. Phase detector 326 may then utilize receiver clock 226 to optimally synchronize the output data 222. In the embodiments of FIGS. 1-10, the present invention is disclosed and discussed as being implemented primarily as hardware circuitry. However, in alternate embodiments, certain of the functions of the present invention may be performed by appropriate software instructions that are executed for performing functions that are equivalent to those functions of the hardware circuitry discussed herein. Additional details for the implementation and utilization of DLL 218 are further discussed below in conjunction with FIGS. 4-10.

Figure 4:
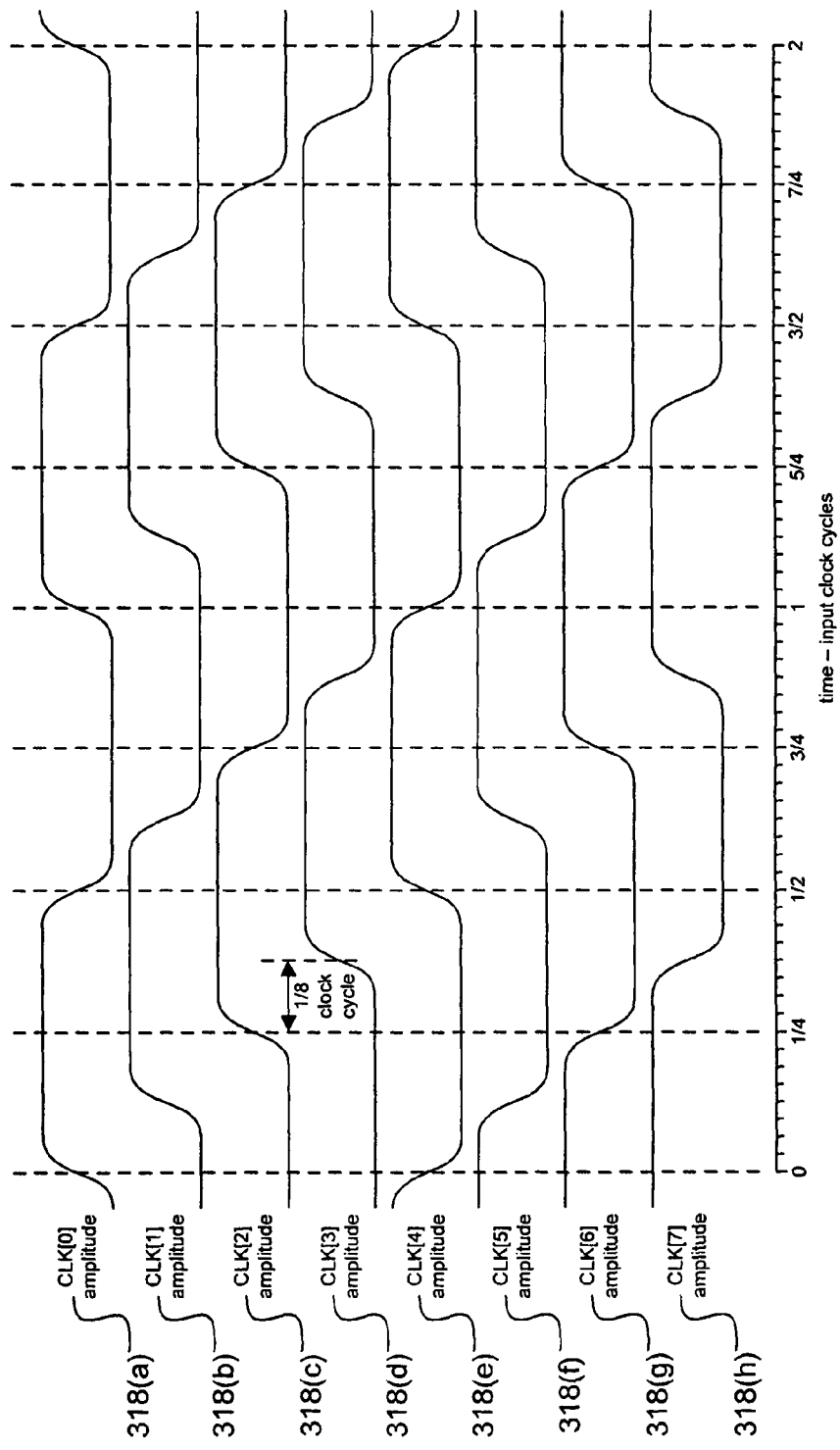
FIG. 4 is a timing diagram for the input clock signals of FIG. 3, in accordance with one embodiment of the present invention.

Referring now to FIG. 4, a timing diagram for the FIG. 3 input clocks 318 is shown, in accordance with one embodiment of the present invention. The FIG. 4 timing diagram is presented for purposes of illustration, and in alternate embodiments, phase interpolator 322 may utilize input clocks 318 with waveform characteristics and timing relationships that are different from certain of those waveform characteristics and timing relationships discussed in conjunction with the FIG. 4 embodiment.

In the FIG. 4 diagram, time is displayed upon a horizontal axis in increments of a base cycle of the input clocks 318. The FIG. 4 embodiment includes an input clock 0 (318($a$)), an input clock 1 (318($b$)), an input clock 2 (318($c$)), an input clock 3 (318($d$)), an input clock 4 (318($e$)), an input clock 5 (318($f$)), an input clock 6 (318($g$)), and an input clock 7 (318($h$)). In the FIG. 4 embodiment, each of the successive input clocks 318 is delayed with respect to the immediately preceding input clock 318 by a clock phase offset which may be expressed as the base clock cycle divided by the number of input clocks 318. In FIG. 4, since there are eight input clocks 318, the clock phase offset is therefore $\frac{1}{8}^{th}$ of the base clock cycle.

In accordance with the present invention, phase interpolator 322 (FIG. 3) utilizes the three most-significant bits (MSBs) of the phase control word 350 to select two adjacent signals from input clocks 318. Phase interpolator 322 may then utilize the three least-significant bits (LSBs) of the phase control word 350 to perform a clock interpolation procedure that interpolates the receiver clock phase of receiver clock 226 (FIG. 3) from the two selected adjacent input clocks 318. Additional details for performing clock interpolation procedures are further discussed below in conjunction with FIGS. 5-10.

Figure 5:
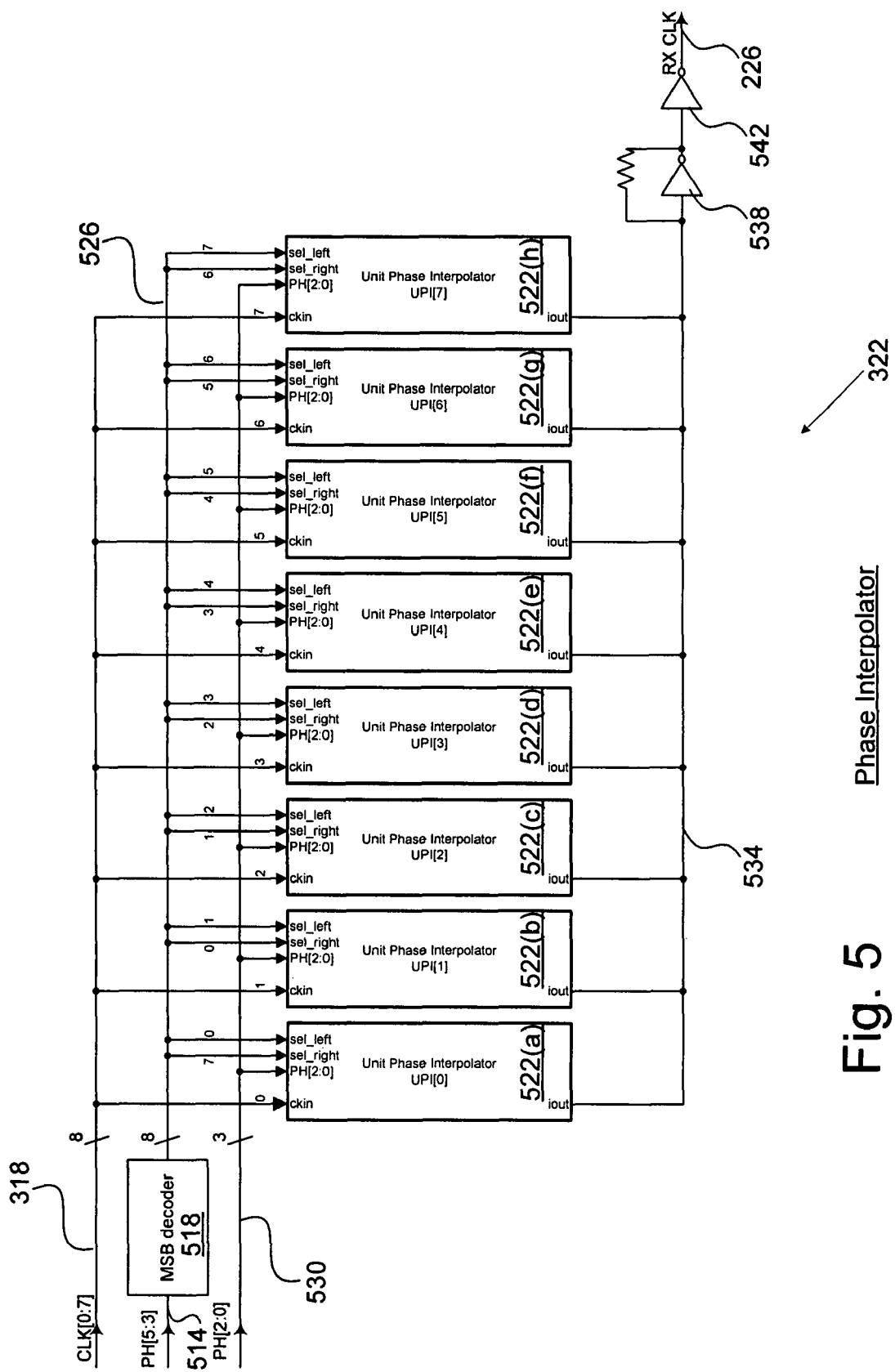
FIG. 5 is a schematic diagram for one embodiment of the phase interpolator from FIG. 3, in accordance with the present invention.

Referring now to FIG. 5, a schematic diagram for one embodiment of the FIG. 3 phase interpolator 322 is shown, in accordance with the present invention. In the FIG. 5 embodiment, phase interpolator 322 may include, but is not limited to, a most-significant bit (MSB) decoder 518, a modular array of unit-phase interpolators (UPIs) 522, a trans-impedance amplifier 538, and a buffer amplifier 542. In alternate embodiments, phase interpolator 322 may be implemented using components and configurations in addition to, or instead of, certain of those components and configurations discussed in conjunction with the FIG. 5 embodiment.

In the FIG. 5 embodiment, phase interpolator 322 includes a UPI[0] 522($a$), a UPI[1] 522($b$), a UPI[2] 522($c$), a UPI[3] 522($d$), a UPI[4] 522($e$), a UPI[5] 522($f$), a UPI[6] 522($g$), and a UPI[7] 522($h$). In certain alternate embodiments, various other numbers of UPIs 522 may be utilized. In the FIG. 5 embodiment, respective ones of the input clocks CLK[0:7] 318 (FIG. 4) are provided as input signals to correspondingly-numbered UPIs 522. For example, input clock[0] 318($a$) (FIG. 4) is provided to UPI[0] 522($a$), etc. Each of the UPIs 522 in phase interpolator 322 therefore receives a similarly-numbered input clock 318.

In the FIG. 5 embodiment, the phase control word 350 (FIG. 3) is divided into a MSB segment PH[5:3] 514 and a LSB segment PH[2:0] 530. In accordance with the present invention, MSB segment 514 may function as a UPI selection signal, and LSB segment 530 may function as a UPI output-control signal. In the FIG. 5 embodiment, both MSB segment 514 and LSB segment 530 are implemented with three binary bits. However, in alternate embodiments, any effective number of bits may be utilized for either MSB segment 514 or LSB segment 530. In the FIG. 5 embodiment, MSB decoder 518 converts MSB segment 514 into eight binary UPI select signals 526 that are output from MSB decoder 518 on an eight-bit wide UPI selector bus.

In the FIG. 5 embodiment, only one of the foregoing UPI select signals 526 may be active for any given MSB segment 514. In the FIG. 5 embodiment, two of the UPI select signals 526 are provided to each of the UPIs 522 in phase interpolator 322. For example, UPI[0] 522($a$) receives bit 7 of the UPI select signals 526 as a sel_right signal, and receives bit 0 of the UPI select signals 526 as a sel_left signal. Similarly, UPI[1] 522($b$) receives bit 0 of the UPI select signals 526 as a sel_right signal, and receives bit 1 of the UPI select signals 526 as a sel_left signal.

In the FIG. 5 embodiment, pairs of adjacent UPIs 522 thus each have one UPI select signal 526 in common. In the FIG. 5 embodiment, phase interpolator 322 may therefore select adjacent pairs of UPIs 522 by activating this shared UPI select signal. For example, UPI[0] 522($a$) and UPI[1] 522($b$) form one adjacent pair of UPIs 522, and may be selected by activating bit 0 of the UPI select signal 526. In the FIG. 5 embodiment, each UPI 522 also receives all three bits of LSB segment PH[2:0] 530 for performing a clock interpolation procedure, as discussed above in conjunction with FIG. 4.

In the FIG. 5 embodiment, each UPI 522 provides a UPI output signal (iout) to a summing path 534. In the FIG. 5 embodiment, the non-selected UPIs 522 typically generate a negligible amount of output current. However, the two adjacent selected UPIs 522 provide UPI output signals (iout) with drive strengths that are controlled by the received LSB segment 530. In the FIG. 5 embodiment, to compensate for the high load capacitance caused by summing multiple UPI output signals, trans-impedance amplifier 538 presents a low impedance, and performs a broad-band current-to-voltage conversion. Buffer amplifier 542 then amplifies the output of trans-impedance amplifier 538 to produce the final receiver clock 226. Additional details regarding the implementation and utilization of the UPIs 522 is further discussed below in conjunction with FIGS. 6-10.

Figure 6:
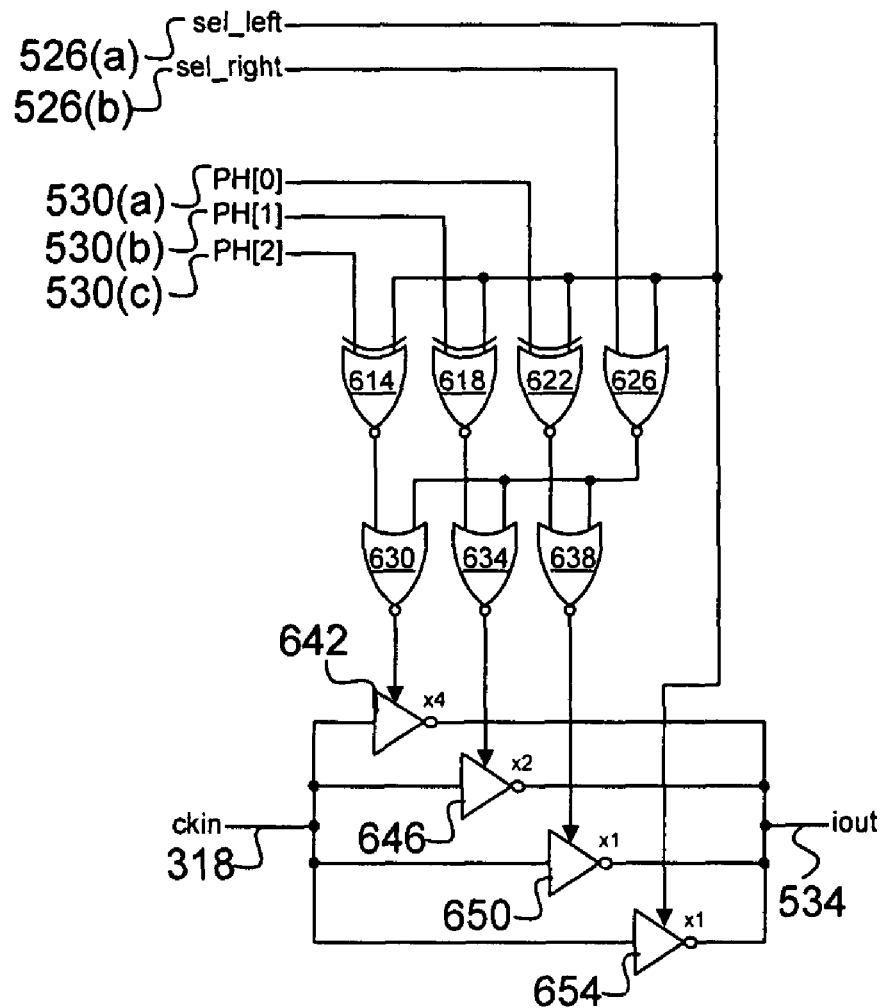
FIG. 6 is a schematic diagram of a unit phase interpolator from FIG. 5, in accordance with one embodiment of the present invention.

Referring now to FIG. 6, a schematic diagram of a FIG. 5 unit phase interpolator (UPI) 522 is shown, in accordance with one embodiment of the present invention. In alternate embodiments, UPIs 522 may be implemented using components and configurations in addition to, or instead of, certain of those components and configurations discussed in conjunction with the FIG. 6 embodiment.

In the FIG. 6 embodiment, UPI 522 receives an LSB segment 530 (FIG. 5) of phase control word 350 (FIG. 3). In particular, a bit 0 PH[0] 530(*a*) is provided to a first input of exclusive NOR gate 622 a bit 1 PH[1] 530(*b*) is provided to a first input of exclusive NOR gate 618, and a bit 2 PH[2] 530(*c*) is provided to a first input of exclusive NOR gate 614. In the FIG. 6 embodiment, a sel_left signal 526(*a*) is provided from MSB decoder 518 (FIG. 5) to second inputs of exclusive NOR gates 614, 618, and 622, and to a second input of a selection NOR gate 626. In addition, a sel_right signal 526(*b*) is provided to a first input of the selection NOR gate 626.

In the FIG. 6 embodiment, a gating signal from selection NOR gate 626 is provided to a second input of gating NOR gates 630, 634, and 638. When either select_left 526(*a*) or select_right 526(*b*) is active, then the gating NOR gates 630, 634, and 638 pass the respective output signals of exclusive NOR gates 614, 618, and 622 to a current source array as corresponding enable signals. The individual bits from the LSB segment 530 of phase control word 350 are thus transformed into individual enable signals.

In particular, a first signal is provided from gating NOR gate 630 to an X4 binary inverter 642, a second signal is provided from gating NOR gate 634 to an X2 binary inverter 646, and a third enable signal is provided from gating NOR gate 638 to a first X1 binary inverter 650. In addition, the sel_left signal 526(*a*) is provided directly to a second X1 binary inverter 654 as a second X1 enable signal.

In the FIG. 6 embodiment, a designated input clock signal ckin 318 (FIG. 3) is provided to the input of each current source 642, 646, 650, and 654 in the current source array. The particular input clock signal 318 depends upon the location of the UPI 522 in the UPI array of phase interpolator 322 (see FIG. 5). The outputs of all the current sources 642, 646, 650, and 654 are summed together as a UPI output signal iout that is then provided to a summing path 524 (FIG. 5).

In the FIG. 6 embodiment, the four binary inverters in UPI 522 may be separately enabled by corresponding enable signals to function as respective current sources to generate the UPI output signal iout. In the FIG. 6 embodiment, X1 current sources 650 and 654 each have a times-one output drive strength. X2 current source 646 has a times-two output drive strength that is twice that of the times-one output drive strength. X4 current source 642 has a times-four output drive strength that is four times that of the times-one output drive strength.

The current sources 642, 646, 650, and 654 in the FIG. 6 current source array may thus be individually enabled by various combinations of binary values from LSB segment 530 to produce eight different levels of UPI output signal iout. In the FIG. 6 embodiment, when sel_right 526(*b*) is active, then PH[0] 530(*a*), PH[1] 530(*b*), and PH[2] 530(*c*) are provided in an unchanged state as enable signals to the current source array, and the UPI output signal 534 ramps upwards as the binary value of LSB segment 530 increases.

However, when sel_left 526(*a*) is active, then selection NOR gate 626, exclusive NOR gates 614, 618, and 622, and second X1 binary inverter 654 are utilized to support a two's complement arithmetic technique in which PH[0] 530(*a*), PH[1] 530(*b*), and PH[2] 530(*c*) are provided in an inverted state as enable signals to the current source array. The UPI output signal 534 then ramps downwards as LSB segment 530 increases. In addition, when sel_left 526(*a*) is active, then second X1 binary inverter 654 is enabled. Additional details regarding UPI 522 are further discussed below in conjunction with FIGS. 7-8 and 10.

Figure 7:
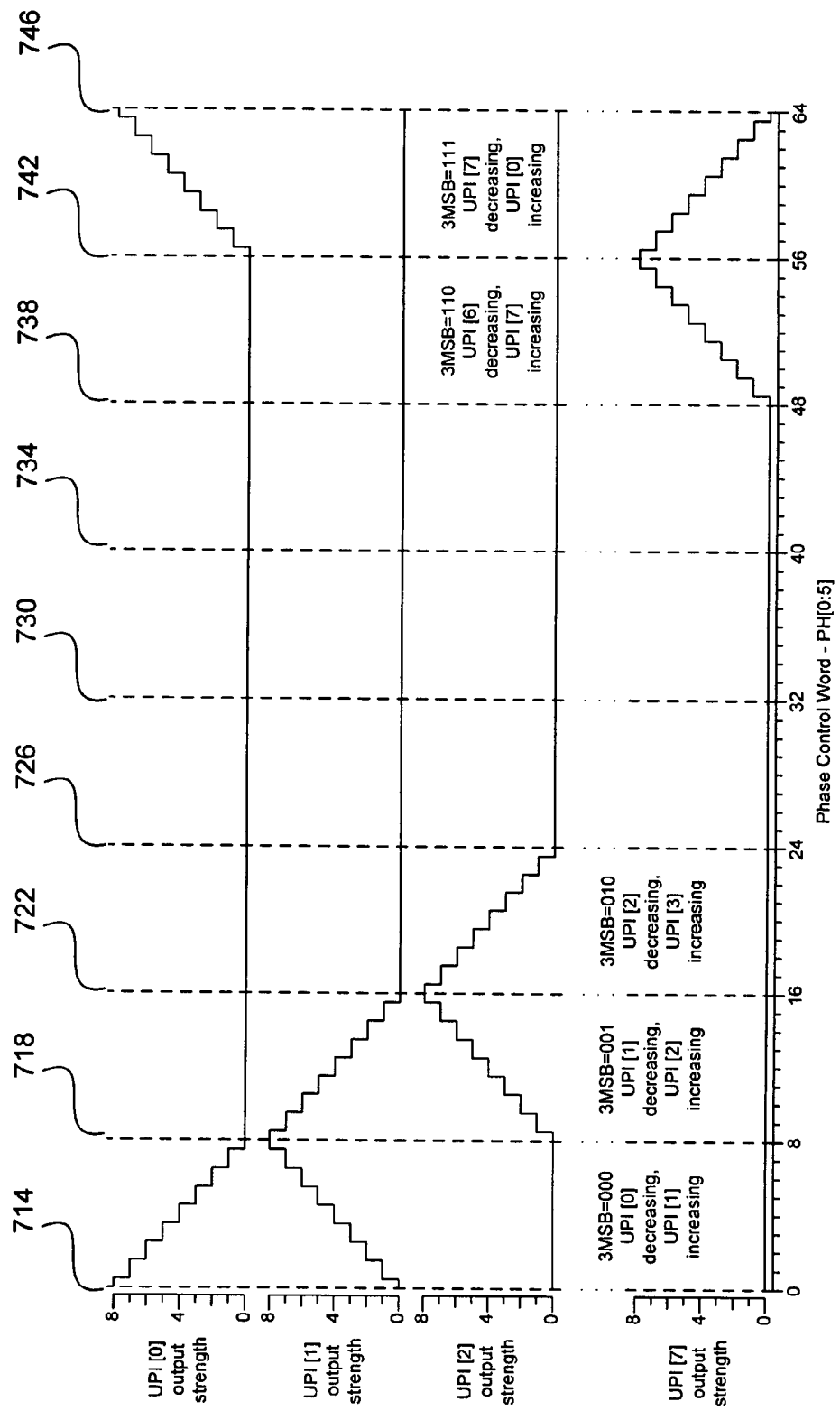
FIG. 7 is a timing diagram for UPI output strengths from FIG. 5, in accordance with one embodiment of the present invention.

Referring now to FIG. 7, a timing diagram for FIG. 5 UPI output drive strengths (iout) is shown, in accordance with one embodiment of the present invention. The FIG. 7 example is provided for purposes of illustration, and in alternate embodiments, phase interpolator 322 may be provide UPI output signals with waveform characteristics and timing relationships in addition to, or instead of, certain of those waveform characteristics and timing relationships discussed in conjunction with the FIG. 7 embodiment.

In the FIG. 7 embodiment, decimal equivalents for the binary six-bit phase control word PH[0:5] 350 (FIG. 3) are displayed on a horizontal axis. The values range from decimal 0 (binary 000000) to decimal 64 (binary 111111). Above the horizontal axis, a series of related timing waveforms showing individual output drive strengths for various UPIs 522 from the FIG. 5 embodiment of phase interpolator 322 are shown. In particular, the FIG. 7 diagram shows output drive strengths for UPI[0] 522(*a*), UPI[1] 522(*b*), UPI[2] 522(*c*), and UPI[7] 522(*h*) that each range from a minimum of zero units to a maximum of eight units on a vertical axis.

In the FIG. 7 diagram, at time 714, an MSB segment 514 of phase control word 350 has selected adjacent unit phase interpolators 522 (UPI[0] and UPI[1]). UPI[0] has an output strength of eight units, while UPI[1] has an output strength of zero units. As the LSB segment 530 of phase control word 350 increases, UPI[0] ramps downward, while UPI[1] simultaneously ramps upward in proportional synchronized steps. At time 718, UPI[0] reaches an output strength of zero units, while UPI[1] reaches an output strength of eight units.

At this point, the MSB segment 514 of phase control word 350 changes state to select the next two adjacent unit phase interpolators 522 (UPI[1] and UPI[2]). UPI[1] has an output strength of eight units, while UPI[2] has an output strength of zero units. As the LSB segment 530 of phase control word 350 increases, UPI[1] ramps downward, while UPI[2] simultaneously ramps upward in proportional steps. At time 722, UPI[1] reaches an output strength of zero units, while UPI[2] reaches an output strength of eight units.

The foregoing interplay between adjacent UPIs 522 may be similarly repeated for all pairs of UPIs 522 in phase interpolator 322. Note that when MSB segment 514 changes state at time 742, UPI[7] 5222(*h*) and UPI[0] 522(*a*) are selected as adjacent UPIs 522, and the FIG. 7 process "wraps around" to subsequently begin again at time 714. Several truth tables with addition information regarding the FIG. 7 process are provided below in FIGS. 9-10.

Referring now to FIG. 8, a schematic diagram for the FIG. 6 times-one binary inverter 650 is shown, in accordance with one embodiment of the present invention. In alternate embodiments, the present invention may utilize components and configurations, in addition to, or instead of, certain of those components and configurations discussed in conjunction with the FIG. 8 embodiment.

In the FIG. 8 embodiment, binary inverter 650 is implemented as a conventional or enhanced CMOS device that provides an input clock signal ckin 318 to a PMOS device 818 and an NMOS device 822. In the FIG. 8 embodiment, binary inverter 650 may also receive an enable signal 814 from a gating NOR gate 638 (FIG. 6) or from another appropriate signal source. When the enable signal is active, then PMOS switch 826 and CMOS switch 830 are closed to allow inverter output current iout 534 to flow.

As in the prior FIG. 6 embodiment, the FIG. 8 binary inverter 650 has a times-one output drive strength. The FIG. 6 second X1 binary inverter 654 may be implemented in a manner that is the same or similar to the FIG. 8 embodiment of binary inverter 650. In addition, the FIG. 6 X2 binary inverter 646 has a times-two output drive strength that is twice that of the times-one output drive strength, and may be implemented by configuring two of the FIG. 8 embodiments in parallel. Furthermore, the FIG. 6 X4 binary inverter 642 has a times-four output drive strength that is four times that of the times-one output drive strength, and may be implemented by configuring four of the FIG. 8 embodiments in parallel.

Referring now to FIG. 9, a truth table for the FIG. 5 MSB decoder 518 is shown, in accordance with one embodiment of the present invention. The FIG. 9 truth table is presented to illustrate certain functions of the FIG. 5 embodiment of phase interpolator 322. In alternate embodiments, MSB decoder 518 may be implemented according to truth tables with input and/or output values that are different from certain of those input and output values discussed in conjunction with the FIG. 9 embodiment.

In the FIG. 9 truth table, an input section shows different possible inputs for MSB decoder 518 (FIG. 5). Each of the possible inputs are arranged in a horizontal row to represent MSB segment PH[5:3] 514 of phase control word 350 (FIG. 3). In addition, in the FIG. 9 truth table, to the right of the respective inputs of MSB segments 514, eight corresponding outputs [0:7] of MSB decoder 518 are presented in the same horizontal row. Note that only one of the eight outputs of MSB decoder 518 is active at any given time. Phase interpolator 322 may thus provide the active output as a UPI select signal to select appropriate pairs of adjacent UPIs 522.

Referring now to FIG. 10, a truth table for the FIG. 6 UPI 522 is shown, in accordance with one embodiment of the present invention. The FIG. 10 truth table is presented to illustrate the operation of the FIG. 6 embodiment of a UPI 522. In alternate embodiments, UPI 522 may be implemented according to truth tables with input and/or output values that are different from certain of those input and output values discussed in conjunction with the FIG. 10 embodiment.

In the FIG. 10 truth table, an input section has five columns of UPI input signals that are arranged in horizontal rows of individual input sets. The FIG. 10 input signals may be best understood in conjunction with the FIG. 6 drawing of UPI 522. In particular, each UPI input set has a sel_left input 526($a$), a sel_right input 526($b$), a PH[2] input 530($a$), a PH[1] input 530($b$), and a PH[2] input 530($c$). In the FIG. 10 embodiment, sel_left 526($a$) and sel_right 526($b$) are outputs from MSB decoder 518 (FIG. 3). In addition, PH[2] 530($a$), PH[1] 530($b$), and PH[2] 530($c$) form the MSB segment 530 of phase control word 350 (FIG. 3).

On the far right of the FIG. 10 truth table, a column of iout current units for summed UPI output signals (FIG. 5) is arranged in individual entries that are each located in the same horizontal row and immediately to the right of the respective UPI input signals. The FIG. 10 UPI output signals (iout) may be best understood in conjunction with both the FIG. 6 drawing of UPI 522 and the FIG. 7 waveform diagram illustrating the operational relationship of the UPI array of phase interpolator 322.

In the FIG. 10 embodiment, the polarity of the iout current units depends on state of input clock ckin 318 (FIG. 6). If the input clock 318 is high, the UPI output iout sinks current. Conversely, if the input clock 318 is low, the UPI output iout sources current. In addition, as illustrated in the FIG. 7 diagram, when a particular UPI 522 is on the "left side" of a selected pair of UPIs 522, then the UPI drive strength gradually reduces from a maximum of ±8 units to ±1 unit as the three LSBs, PH[2:0], change from binary 000 to binary 111. Conversely, when a given UPI 522 is on the "right side" of a selected pair of UPIs 522, then the UPI drive strength increases from a minimum of 0 units to a maximum of ±7 units as the three LSBs, PH[2:0], change from binary 000 to binary 111.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. A system for utilizing a phase interpolator to support a data transmission procedure, comprising:
a modular array of unit phase interpolators that receive input clock signals, said unit phase interpolators being arranged in a single parallel stage, said unit phase interpolators responsively generating UPI output signals that are summed together to produce a receiver clock signal;
a phase control word that includes a UPI selection segment and a UPI output-control segment, said unit phase interpolators receiving said UPI selection segment to selectively activate a selected pair of said unit phase interpolators, said unit phase interpolators utilizing said UPI output-control segment for controlling said UPI output signals by defining an interpolation ratio for combining phase characteristics of said input clock signals from said selected pair of said unit phase interpolators to thereby adjust phase characteristics of said receiver clock signal.

2. The system of claim 1 wherein said phase interpolator is implemented in a digital delay-locked loop in a receiver device.

3. The system of claim 1 wherein said input clock signals are provided from a clock source device to said phase interpolator, said input clock signals each having a different clock phase.

4. The system of claim 1 wherein said receiver clock signal is provided to a phase detector that responsively generates an up/down signal that indicates whether said receiver clock leads or lags an input data signal.

5. The system of claim 4 wherein said up/down signal is provided directly to an up/down counter that increments or decrements said phase control word stored in said up/down counter depending upon a current state of said up/down signal.

6. The system of claim 5 wherein said phase control word is provided directly from said up/down counter to said phase interpolator via a feedback loop for dynamically adjusting said phase characteristics of said receiver clock signal.

7. The system of claim 5 wherein said receiver clock signal is processed by a programmable divider to produce an update clock for updating said phase control word in said up/down counter, said programmable divider determining a feedback response time for said feedback loop.

8. The system of claim 1 wherein said input clock signals include eight input clocks with different clock phases, said unit phase interpolators including eight unit phase interpolators that received correspondingly-numbered ones of said eight input clocks.

9. The system of claim 1 wherein a trans-impedance amplifier performs a current-to-voltage conversion to convert said UPI output signals to said receiver clock signal.

10. The system of claim 1 wherein an MSB decoder converts said UPI select segment of said phase control word into a series of UPI selection signals that are provided to sequentially activate different ones of said unit phase interpolators.

11. The system of claim 10 wherein said UPI select segment is implemented as three most-significant bits of said phase control word, said MSB decoder responsively generating seven individual ones of said UPI selection signals.

12. The system of claim 11 wherein said phase interpolator selectively activates said pair of said unit phase interpolators by utilizing said UPI selection signals to concurrently activate two adjacent ones of said unit phase interpolators at any given time.

13. The system of claim 1 wherein each of said unit phase interpolators is implemented in a substantially similar manner.

14. The system of claim 13 wherein each of said unit phase interpolators includes a current source array of binary inverters that are configured in a parallel manner, said current source array receiving one of said input clock signals as an array input signal that is provided to each of said binary inverters, said current source array summing individual inverter output signals from said binary inverters to produce a corresponding one of said UPI output signals.

15. The system of claim 14 wherein said binary inverters include a first times-one inverter and a second times-one inverter that each have a times-one output strength, said binary inverters also including a times-two inverter with a times-two output strength that is twice said times-one output strength, said binary inverters further including a times-four inverter with a times-four output strength that is four times said times-one output strength.

16. The system of claim 15 wherein a bit 0 from said UPI output-control segment is utilized to generate a first times-one enable signal to activate said first times-one inverter, a bit 1 from said UPI output-control segment is utilized to generate a times-two enable signal to activate said times-two inverter, and a bit 2 from said UPI output-control segment is utilized to generate a times-four enable signal to activate said times-four inverter.

17. The system of claim 16 wherein a given one of said unit phase interpolators receives a select left signal and a select right signal that are both derived from said UPI selection segment, said given one of said unit phase interpolators being selected when either said select left signal or said select right signal are active.

18. The system of claim 17 wherein said bit 0, said bit 1, and said bit 2 of said UPI output-control segment are inverted when said select left signal is active.

19. The system of claim 17 wherein said second times-one inverter is enabled when said select left signal is active.

20. The system of claim 17 wherein said binary inverters are implemented as current sources by utilizing CMOS devices.

21. A method for utilizing a phase interpolator to support a data transmission procedure, comprising the steps of:
  receiving input clock signals with a modular array of unit phase interpolators that responsively generate UPI output signals, said unit phase interpolators being arranged in a single parallel stage;
  summing together said UPI output signals to produce a receiver clock signal;
  generating a phase control word that includes a UPI selection segment and a UPI output-control segment;
  utilizing said UPI selection segment to selectively activate a selected pair of said unit phase interpolators; and
  utilizing said UPI output-control segment for controlling said UPI output signals by defining an interpolation ratio for combining phase characteristics of said input clock signals from said selected pair of said unit phase interpolators to thereby adjust phase characteristics of said receiver clock signal.

22. The method of claim 21 wherein said phase interpolator is implemented in a digital delay-locked loop in a receiver device.

23. The method of claim 21 wherein said input clock signals are provided from a clock source device to said phase interpolator, said input clock signals each having a different clock phase.

24. The method of claim 21 wherein said receiver clock signal is provided to a phase detector that responsively generates an up/down signal that indicates whether said receiver clock leads or lags an input data signal.

25. The method of claim 24 wherein said up/down signal is provided directly to an up/down counter that increments or decrements said phase control word stored in said up/down counter depending upon a current state of said up/down signal.

26. The method of claim 25 wherein said phase control word is provided directly from said up/down counter to said phase interpolator via a feedback loop for dynamically adjusting said phase characteristics of said receiver clock signal.

27. The method of claim 25 wherein said receiver clock signal is processed by a programmable divider to produce an update clock for updating said phase control word in said up/down counter, said programmable divider determining a feedback response time for said feedback loop.

28. The method of claim 21 wherein said input clock signals include eight input clocks with different clock phases, said unit phase interpolators including eight unit phase interpolators that received correspondingly-numbered ones of said eight input clocks.

29. The method of claim 21 wherein a trans-impedance amplifier performs a current-to-voltage conversion to convert said UPI output signals to said receiver clock signal.

30. The method of claim 21 wherein an MSB decoder converts said UPI select segment of said phase control word into a series of UPI selection signals that are provided to sequentially activate different ones of said unit phase interpolators.

31. The method of claim 30 wherein said UPI select segment is implemented as three most-significant bits of said phase control word, said MSB decoder responsively generating seven individual ones of said UPI selection signals.

32. The method of claim 31 wherein said phase interpolator selectively activates said pair of said unit phase interpolators by utilizing said UPI selection signals to concurrently activate two adjacent ones of said unit phase interpolators at any given time.

33. The method of claim 21 wherein each of said unit phase interpolators is implemented in a substantially similar manner.

34. The method of claim 33 wherein each of said unit phase interpolators includes a current source array of binary inverters that are configured in a parallel manner, said current source array receiving one of said input clock signals as an array input signal that is provided to each of said binary inverters, said current source array summing individual inverter output signals from said binary inverters to produce a corresponding one of said UPI output signals.

35. The method of claim 34 wherein said binary inverters include a first times-one inverter and a second times-one inverter that each have a times-one output strength, said binary inverters also including a times-two inverter with a times-two output strength that is twice said times-one output strength, said binary inverters further including a times-four inverter with a times-four output strength that is four times said times-one output strength.

36. The method of claim 35 wherein a bit 0 from said UPI output-control segment is utilized to generate a first times-one enable signal to activate said first times-one inverter, a bit 1 from said UPI output-control segment is utilized to generate a times-two enable signal to activate said times-two inverter, and a bit 2 from said UPI output-control segment is utilized to generate a times-four enable signal to activate said times-four inverter.

37. The method of claim 36 wherein a given one of said unit phase interpolators receives a select left signal and a select right signal that are both derived from said UPI selection segment, said given one of said unit phase interpolators being selected when either said select left signal or said select right signal are active.

38. The method of claim 37 wherein said bit 0, said bit 1, and said bit 2 of said UPI output-control segment are inverted when said select left signal is active.

39. The method of claim 37 wherein said second times-one inverter is enabled when said select left signal is active.

40. The method of claim 37 wherein said binary inverters are implemented as current sources by utilizing CMOS devices.

41. A system for utilizing a phase interpolator to support a data transmission procedure, comprising:
   means for receiving input clock signals and responsively generating UPI output signals, said means for receiving being arranged in a single parallel stage;
   means for summing together said UPI output signals to produce a receiver clock signal;
   means for generating a phase control word that includes a UPI selection segment and a UPI output-control segment;
   means for utilizing said UPI selection segment to selectively activate certain units of said means for receiving; and
   means for utilizing said UPI output-control segment for controlling said UPI output signals by defining an interpolation ratio for combining phase characteristics of said input clock signals from said certain units to thereby adjust phase characteristics of said receiver clock signal.

* * * * *